GYRATOR NETWORK

Filed Oct. 27, 1967

3,546,639

GYRATOR NETWORK

Anthony John Drew, Sidcup, and Jerzy Gorski-Popiel, London, England, assignors to Associated Electrical Industries Limited, London, England, a British company Filed Oct. 27, 1967, Ser. No. 678,582
Claims priority, application Great Britain, Nov. 1, 1966, 48,937/66
Int. Cl. H03h *7/44, 11/00*
U.S. Cl. 333—80 6 Claims

ABSTRACT OF THE DISCLOSURE

A gyrator network in which its transfer impedances $-Z_{12}$ and $Z_{21}$ are afforded by respective current controlled voltage amplifiers which are realised using operational amplifiers.

BACKGROUND OF THE INVENTION

This invention relates to electrical networks and in particular to gyrators, sometimes referred to as positive impedance inverters.

SUMMARY OF THE INVENTION

Gyrators, which are coming into use as basic circuit elements in the realization of networks such as filters, as discussed for example by B. D. H. Tellegen, Phillips Technical Review, 1956/57, vol. 18, p. 120, may be defined in general terms as two-port networks which when terminated at their output port by an impedance $Z_L$ present at their input port an impedance $Z_{in}$ given by:

$$Z_{in}=K/Z_L$$

Thus when terminated by a capacitive load a gyrator presents an inductive impedance at its input port.

As discussed by Tellegen the gyrator is characterized by transfer impedances of opposite sign, and in accordance with the present invention these transfer impedances are afforded by respective current controlled voltage amplifiers.

In further considering the nature of the invention reference will now be made by way of example to the accompanying drawing of which:

DESCRIPTION OF THE PREFERRED EMBODIMENT

Figure 1:
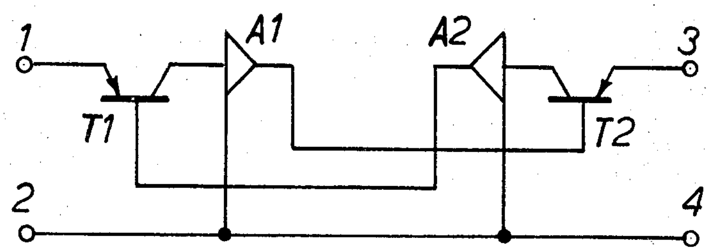
FIG. 1 shows a basic circuit of a gyrator according to the invention.

Referring to the drawing, the basic circuit of a gyrator shown in FIG. 1 comprises two current controlled voltage amplifiers A1 and A2 and two transistors T1 and T2. The two amplifiers A1 and A2 have transfer impedances which are of opposite sign but which can be of equal magnitude.

The two transistors T1 and T2 provide separation of the voltage and current at the two ports 1, 2 and 3, 4 of the circuit, respectively. The current $I_1$ into the port 1, 2 of the circuit for driving the amplifier A1 is the current through transistor T1. The voltage $V_1$ across the port 1, 2 is the voltage at the base of transistor T1 as produced by the amplifier A2, this voltage appearing across the port 1, 2 due to the emitter follower action of the transistor T1. Similarly, the current $I_2$ into the port 3, 4 of the circuit for driving the amplifier A2 is the current through transistor T2, and the voltage $V_2$ across the port 3, 4 is the voltage at the base of transistor T2 as produced by the amplifier A1, the emitter follower action of the transistor T2 causing this voltage to appear across port 3, 4.

Figure 2:
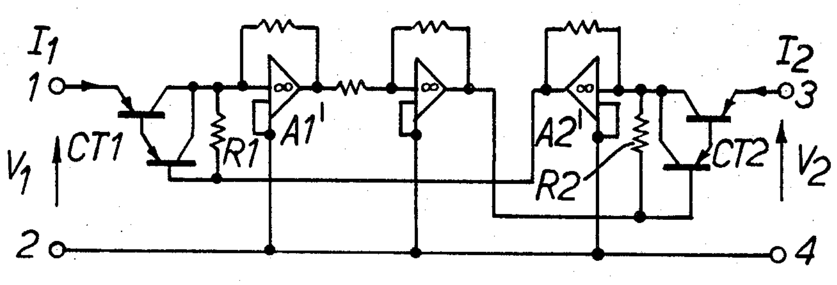
FIG. 2 shows a practical realisation of the circuit of FIG. 1.

In the basic circuit shown in FIG. 2 the amplifiers A1 and A2 may be assumed perfect to the first approximation since they can be high gain amplifiers with appreciable feedback. The main defects of the circuit will be due to the two transistors T1 and T2. FIG. 2 shows a circuit in which these defects may be reduced. Darlington compound transistor pairs CT1 and CT2 replace the two transistors T1 and T2 to give a current gain very close to unity, so that the currents fed to the amplifiers are of substantially the same value as the input currents $I_1$ and $I_2$. The input of each of the amplifiers A1′ and A2′ is a virtual earth so that the transistor parameter $h_{12}$ of the transistor pairs CT1 and CT2 is of no consequence. The effects of the transistor parameter $h_{11}$ may be removed by the connection of the two resistances R1 and R2 as shown. Resistance R1 will correct for $h_{11}$ of the transistor pair CT1 and resistance R2 will correct for $h_{11}$ of the transistor pair CT2. Also, these two resistances R1 and R2 will absorb the collector impedances of the two transistor pairs CT1 and CT2.

The amplifiers A1′ and A2′ are differential amplifiers which function as operational amplifiers by each having one of their inputs connected directly to ground. The output from amplifier A1′ is fed via a further operational amplifier which serves to change the sign of the transfer impedance afforded by amplifier A1′.

We claim:

1. A gyrator network comprising first and second ports, first and second current controlled amplifiers, first and second transistors each having emitter, base and collector electrodes and current paths therebetween, means including the emitter-collector path of the first transistor for coupling said first port to the input of the first amplifier, means including the emitter-collector path of the second transistor for coupling the second port to the input of the second amplifier, means including the base-emitter path of the first transistor for coupling the output of the second amplifier to the first port, and means including the base-emitter path of the second transistor for coupling the output of the first amplifier to the second port.

2. A gyrator network comprising first and second ports, first and second current controlled amplifiers, first and second compound transistor pairs each having effective emitter, base and collector terminals and current paths therebetween, means including the effective emitter-collector path of the first transistor pair for coupling said first port to the input of the first amplifier, means including the effective emitter-collector path of the second transistor pair for coupling the second port to the input of the second amplifier, means including the effective base-emitter path of the first transistor pair for coupling the output of the second amplifier to the first port, and means including the effective base-emitter path of the second transistor pair for coupling the output of the first amplifier to the second port.

3. A network in accordance with claim 2 wherein a first resistor is connected between the effective collector and base terminals of the first transistor pair and a second resistor is connected between the effective collector and base terminals of the second transistor pair.

4. A network in accordance with claim 1 wherein said current controlled amplifiers comprise operational amplifiers.

5. A network in accordance with claim 4 wherein the operational amplifiers comprise differential amplifiers each having one input connected to ground.

6. A network in accordance with claim 1 wherein one of said current controlled amplifiers comprises an operational amplifier while the other current controlled amplifier comprises two operational amplifiers connected in cascade.

References Cited

UNITED STATES PATENTS

| | | | |
|---|---|---|---|
| 2,733,304 | 1/1956 | Koenig | 179—170T |
| 2,817,822 | 12/1957 | Meyers | 333—80 |
| 2,885,492 | 5/1959 | D'Heedene | 179—170 |
| 3,401,352 | 9/1968 | Mitra | 333—80 |

KATHLEEN CLAFFY, Primary Examiner

W. A. HELVESTINE, Assistant Examiner

U.S. Cl. X.R.

307—262